United States Patent
Chen et al.

(10) Patent No.: US 10,238,005 B2
(45) Date of Patent: Mar. 19, 2019

(54) INSTALLING ASSEMBLY AND HEAT SINK USING THE SAME

(71) Applicant: NANNING FUGUI PRECISION INDUSTRIAL CO., LTD., Nanning (CN)

(72) Inventors: Wei-Hsi Chen, New Taipei (TW); Li-Pin Hsu, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 514 days.

(21) Appl. No.: 15/047,296

(22) Filed: Feb. 18, 2016

(65) Prior Publication Data

US 2017/0182608 A1 Jun. 29, 2017

(30) Foreign Application Priority Data

Dec. 29, 2015 (TW) .............................. 104144199 A

(51) Int. Cl.
*H05K 7/20* (2006.01)
*F04D 29/64* (2006.01)
(Continued)

(52) U.S. Cl.
CPC ......... *H05K 7/20172* (2013.01); *F01D 25/24* (2013.01); *F04B 39/14* (2013.01); *F04D 29/646* (2013.01); *G06F 1/20* (2013.01)

(58) Field of Classification Search
CPC ....... G06F 1/20; G06F 1/203; H01L 23/4093; F04D 29/522; F04D 29/646; F04D 29/0693; F04D 29/584; F04D 29/40; F04D 29/60; F04D 29/607; F01D 25/24; F01D 25/243; F01D 25/246; F01D 25/26; F01D 25/265; F01D 25/28; F01D 25/30; F04B 39/14;
(Continued)

(56) References Cited

U.S. PATENT DOCUMENTS 6,272,011 B1* 8/2001 Chen .................. G11B 33/08
248/611
7,920,384 B2* 4/2011 Westphall ................ G06F 1/20
361/695
(Continued)

FOREIGN PATENT DOCUMENTS

| CN | 203181477 | 9/2013 |
|----|-----------|--------|
| TW | M378607 | 4/2010 |
| TW | 201328478 | 7/2013 |

*Primary Examiner* — Zachary Pape
(74) *Attorney, Agent, or Firm* — ScienBiziP, P.C.

(57) ABSTRACT

A heat sink includes a cooling module and an installing assembly for fixing the heat sink on a housing. The installing assembly includes a case, a handle rotatably fixed in the case and a support including a fixing board with blocks and two brackets. The handle is actively connected with the support. The fixing board is fixed on a bottom plate of the case. The handle includes two bulges. The brackets include two slide openings for receiving the bulges. When the heat sink is installed, the handle is rotated to be vertical, the bulges are out of the slide openings, and the blocks are stuck on the housing. When the heat sink is dismantled, the handle is rotated to be horizontal and the bulges are stuck into the slide openings to resist the brackets, thereof the fixing board being uplifted and the blocks being pushed away from the housing.

20 Claims, 6 Drawing Sheets

(51) Int. Cl.
*F01D 25/24* (2006.01)
*G06F 1/20* (2006.01)
*F04B 39/14* (2006.01)

(58) Field of Classification Search
CPC .......................... F04B 53/22; F04C 2230/604; F04C 2230/70; F04C 2230/80
USPC ....... 361/679.46–679.54, 688–723; 415/220, 415/213.1, 214.1; 417/360; 454/184
See application file for complete search history.

(56) References Cited

U.S. PATENT DOCUMENTS

| | | | | |
|---|---|---|---|---|
| 8,116,082 | B2* | 2/2012 | Beaudoin | H05K 7/20581 |
| | | | | 211/41.17 |
| 8,582,303 | B2* | 11/2013 | Chiu | G06F 1/20 |
| | | | | 248/222.52 |
| 8,830,673 | B2* | 9/2014 | Kuo | H05K 7/20172 |
| | | | | 312/236 |
| 9,152,189 | B2* | 10/2015 | Fan | G06F 1/187 |
| 9,898,057 | B2* | 2/2018 | Huang | G06F 1/183 |

\* cited by examiner

INSTALLING ASSEMBLY AND HEAT SINK USING THE SAME

CROSS-REFERENCE TO RELATED APPLICATIONS

This application claims priority to TW patent application no. 104144199 filed on Dec. 29, 2015, the contents of which are incorporated by reference herein.

FIELD

The subject matter herein generally relates to an installing assembly and a heat sink using the same.

BACKGROUND

Heat generated by light sources mounted in an electronic device is generally dissipated by a heat sink assembled in the electronic device. The heat sink is generally mounted in the electronic device via screws, which results in inconvenient in installation and demolition of the heat sink.

BRIEF DESCRIPTION OF THE DRAWINGS

Implementations of the present technology will now be described, by way of example only, with reference to the attached figures.

DETAILED DESCRIPTION

Figure 1:
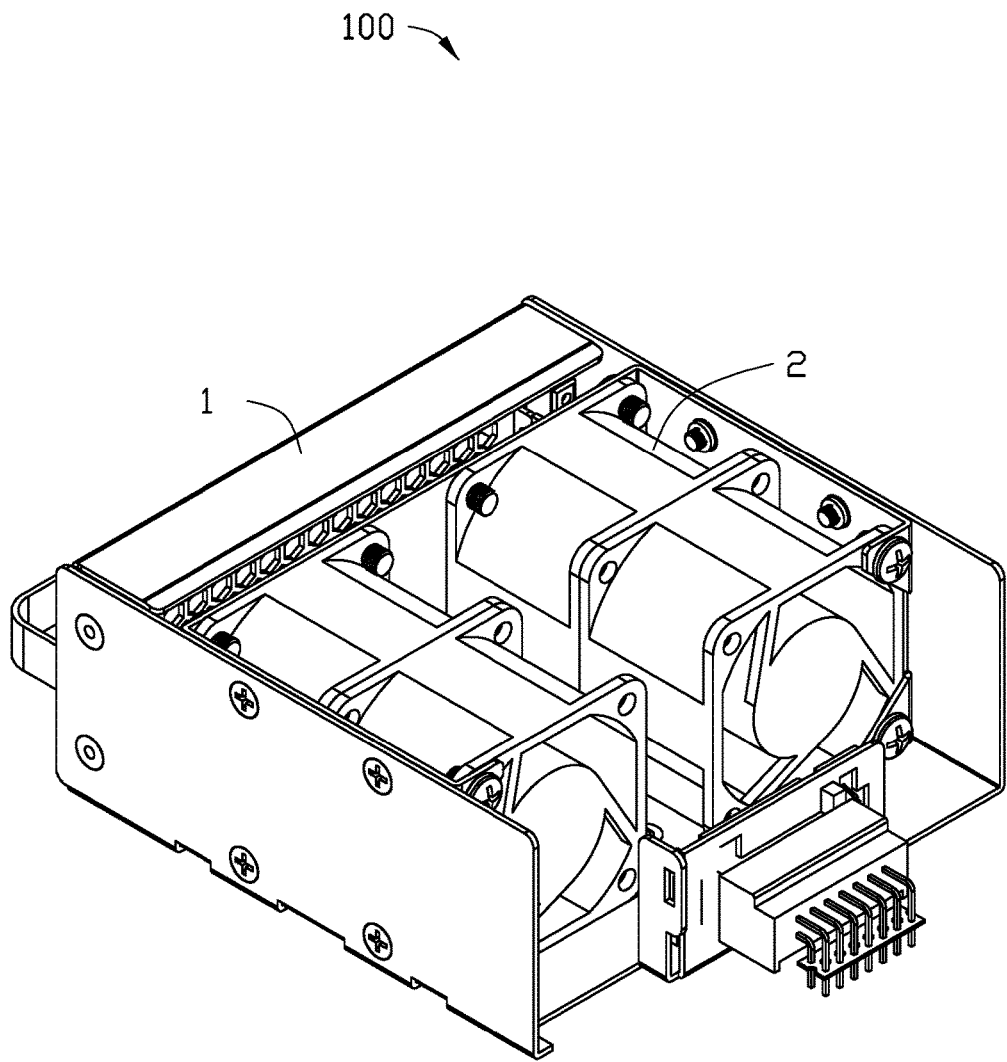
FIG. 1 is an assembled, isometric view of a heat sink in accordance with an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially rectangular" means that the object resembles a rectangle, but can have one or more deviations from a true rectangle. The term "comprising" when utilized, means "including, but not necessarily limited to"; it specifically indicates open-ended inclusion or membership in the so-described combination, group, series and the like.

Figure 6:
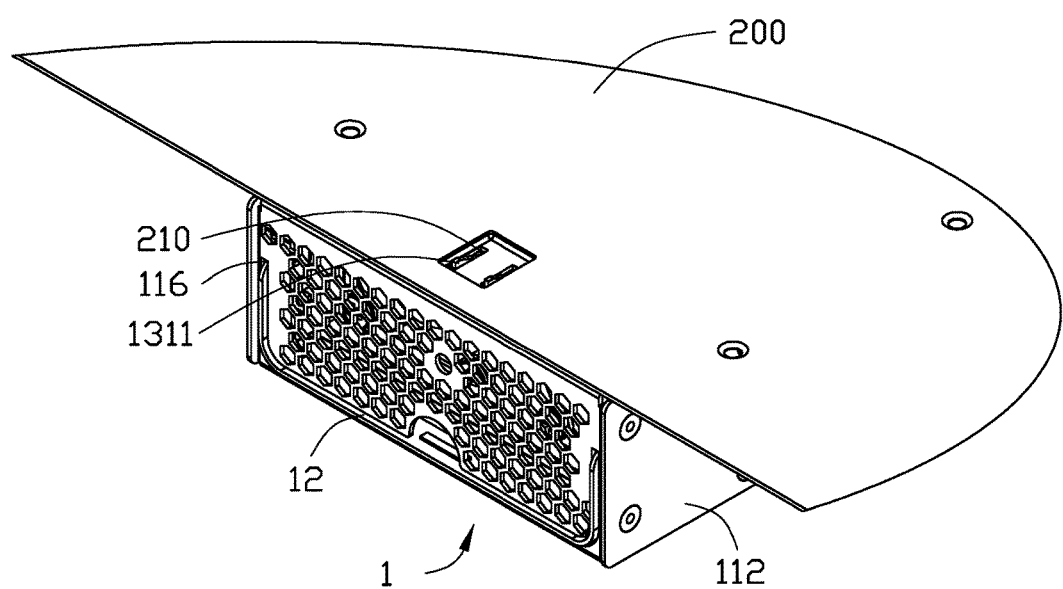
FIG. 6 is an assembled, isometric view of the installing assembly in FIG. 3 shown with mounted on a housing of an electronic device.

Referring to FIG. 1, a heat sink 100 of the exemplary embodiment in the present disclosure includes an installing assembly 1 and a cooling module 2 mounted in the installing assembly 1. Referring to FIG. 6 at the same time, the heat sink 100 is detachably mounted on a housing 200 of an electronic device.

Figure 3:
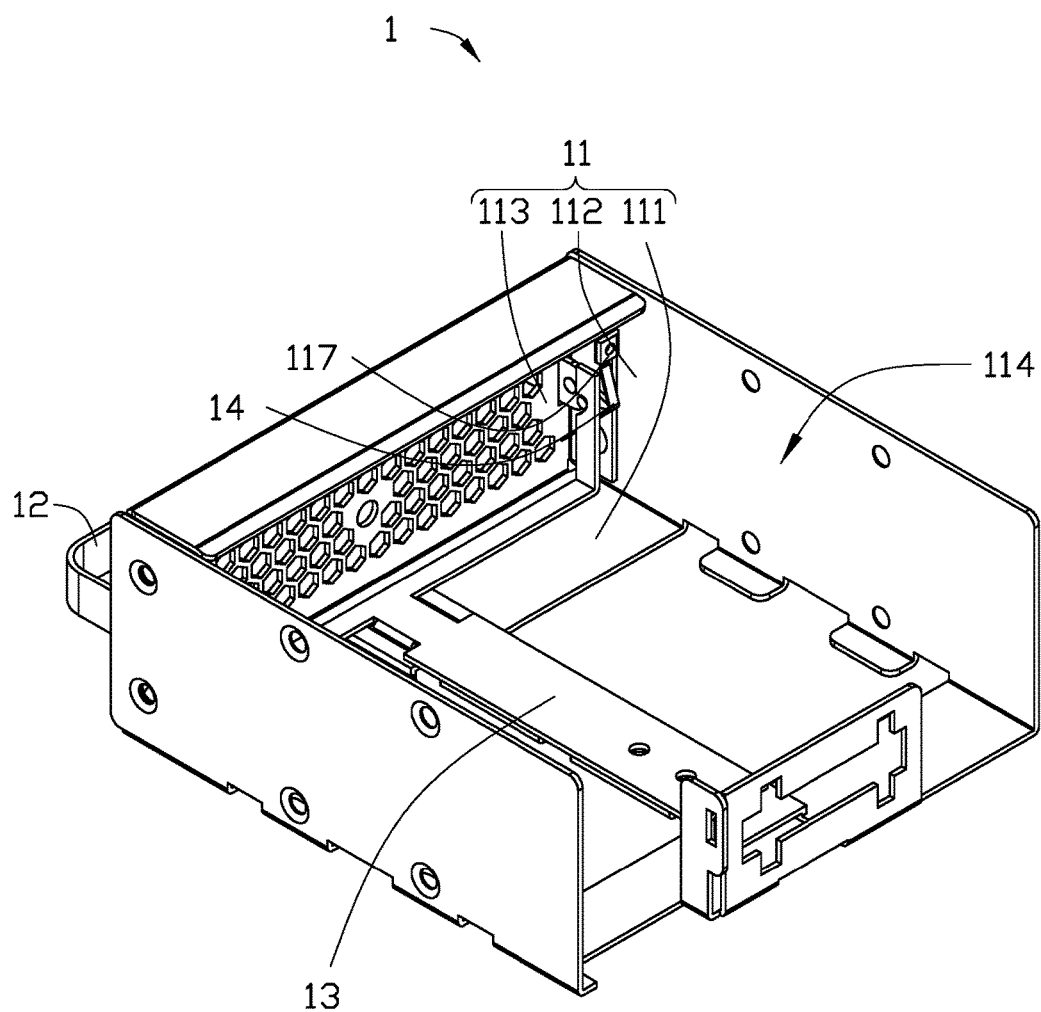
FIG. 3 is an assembled, isometric view of an installing assembly shown in FIG. 1.

Referring to FIG. 3, the installing assembly 1 includes a case 11, a handle 12, a support 13 and two elastic members 14. The support 13 and the elastic members 14 are fixed in the case 11. The handle 12 is rotatably mounted in the case 11. And the handle 12 is actively connected with the support 13 and the elastic members 14.

Figure 2:
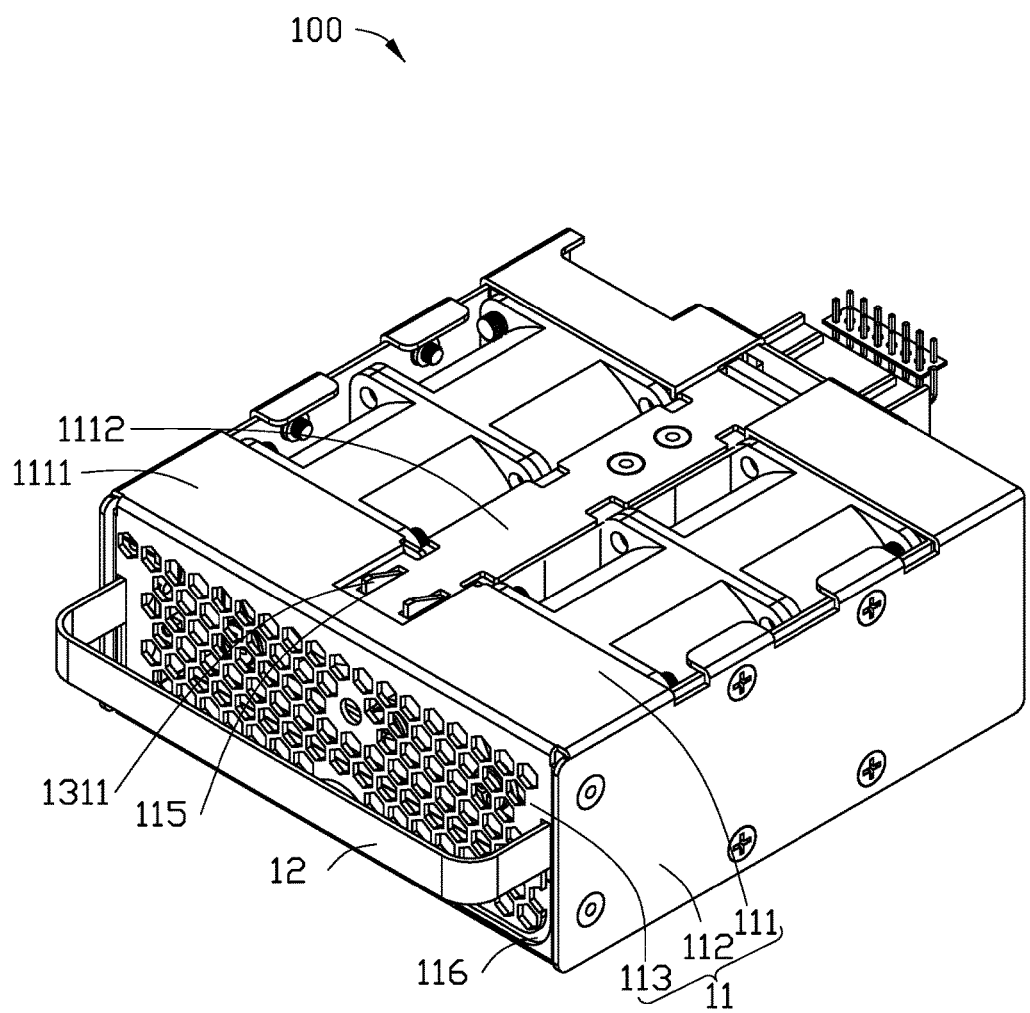
FIG. 2 is an assembled, isometric view of the heat sink in FIG. 1 shown from another aspect.

Referring to FIG. 2 and FIG. 3, the case 11 includes a bottom plate 111, two side plates 112 and an end plate 113. The side plates 112 are perpendicular to the bottom plate 111. And the two side plates 112 are parallel to and spaced from each other. The end plate 113 is connected to the side plates 112 and the bottom plate 111. And the end plate 113 is perpendicular to the side plates 112 and the bottom plate 111. The bottom plate 111, the side plates 112 and the end plate 113 together define a cavity 114. In this exemplary embodiment, the cavity 114 is substantially rectangular. In this exemplary embodiment, the bottom plate 111 is substantially I-shaped. The bottom plate 111 includes two edges 1111 and a middle plate 1112 interconnected between the two edges 1111. The middle plate 1112 and each of the side plates 112 define a gap therebetween.

The bottom plate 111 defines two first grooves 115. The first grooves 115 are closed to the end plate 113. The two first grooves 115 are parallel to and spaced from each other. Each first groove 115 penetrates through top to bottom surfaces of the bottom plate 111. An extension direction of each first groove 115 is perpendicular to the end plate 113.

The end plate 113 defines a chamber 116 for receiving the handle 12. The chamber 116 penetrates through the end plate 113 and is communicated to the cavity 114. In this exemplary embodiment, the chamber 116 is substantially U-shaped facing the bottom plate 111.

Each side plate 112 includes a flange 117 formed on the inner surface thereof for fixing a corresponding elastic member 14. The flange 117 is closed to and spaced from the end plate 113 and perpendicular to the side plate 112. The two flanges 117 are parallel to the end plate 113.

Figure 4:
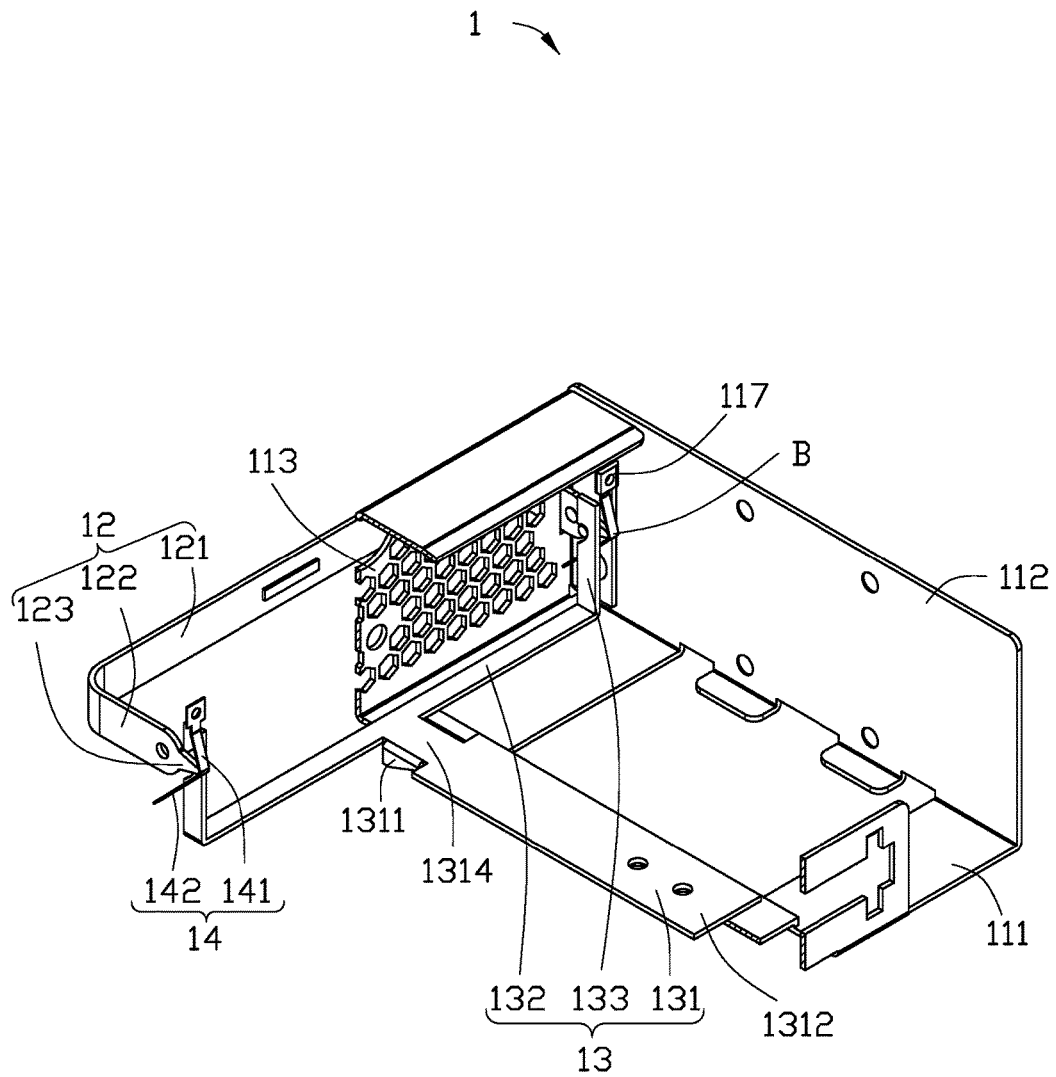
FIG. 4 is an assembled, isometric view of the installing assembly in FIG. 3 shown with a casing semi-sectioned.
Figure 5:
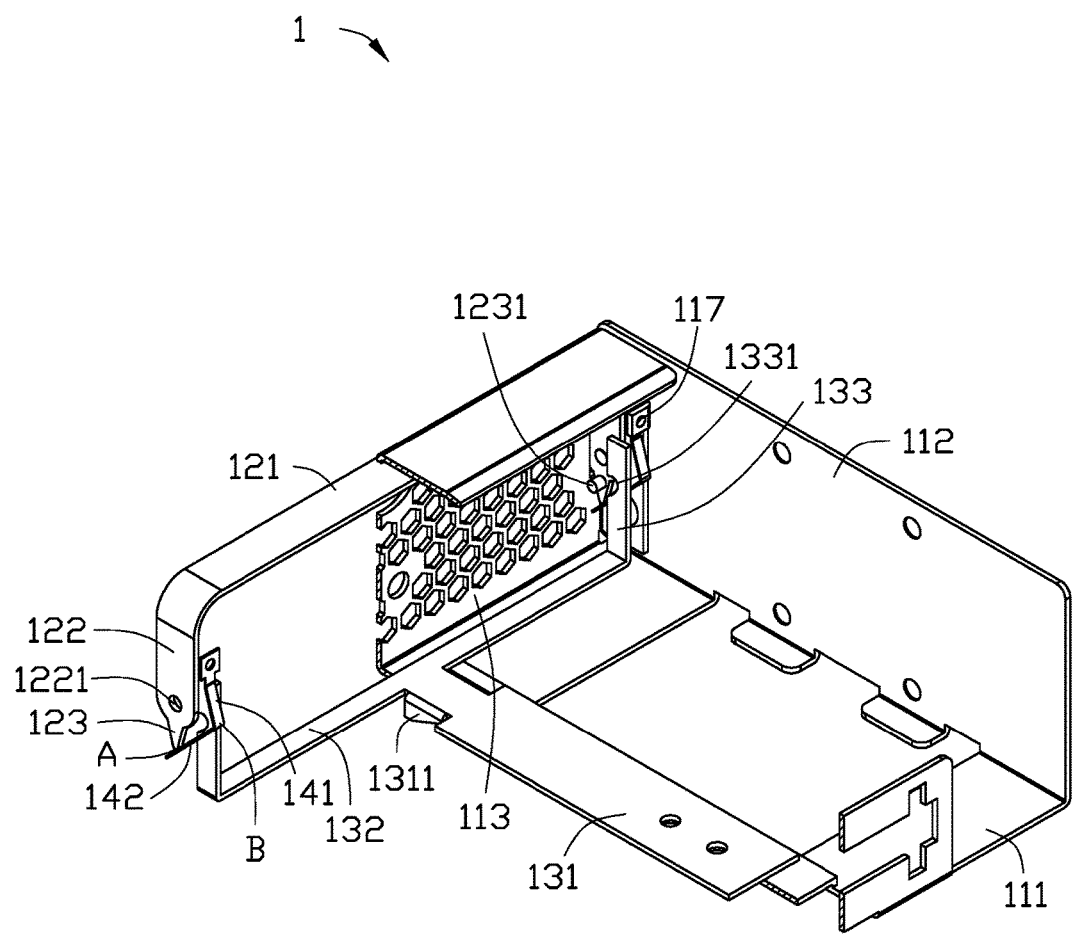
FIG. 5 is an assembled, isometric view of the installing assembly in FIG. 4 shown with a handle folded.

Referring to FIG. 4 and FIG. 5, the handle 12 is substantially U-shaped. The handle 12 can be completely received in the chamber 116 of the case 11. The handle 12 includes an operating portion 121, two fixing portions 122 and two resisting portions 123. The operating portion 121 is a flat rod. The two fixing portions 122 respectively extend from two ends of the operating portion 121. The fixing portions 122 are perpendicular to the operating portion 121. The two resisting portions 123 respectively extend from two free ends of the two fixing portions 122. An extension direction of each resisting portion 123 is the same with that of a corresponding fixing portion 122. Each resisting portion 123 is substantially triangular. A peak of the triangular resisting portion 123 is away from the corresponding fixing portion 122. For convenience, the peak of the triangular resisting portion 123 is defined as peak A.

Each fixing portion 122 defines an axle hole 1221. The axle holes 1221 are defined away from the operating portion 121. The handle 12 is rotatably mounted on the side plates 112 of the case 11 via the axle holes 1221. Specifically, the operating portion 121 of the handle 12 is located outside of the cavity 114 of the case 11. The two fixing portions 122 of the handle 12 are inserted into the chamber 116 of the case 11 and further into the cavity 114 to be mounted on the side plates 112 of the case 11 via the axle holes 1221. The handle 12 can be rotated with respect to the axle holes 1221 and actively connected with the case 11. Thus, the handle 12 can be folded in the chamber 116 of the case 11, as shown in FIG. 5; the handle 12 can also be taken out of the chamber 116 of the case 11, as shown in FIG. 4.

Each resisting portion 123 includes a bulge 1231 formed on its surface. The bulge 1231 is perpendicular to the resisting portion 123. The bulge 1231 is closed to the fixing portion 122. Each bulge 1231 extends from a corresponding resisting portion 123 toward another resisting portion 123. The two bulges 1231 face to each other. Each bulge 1231 is located between the axle hole 1221 of the fixing portion 122 and the peak A of the resisting portion 123.

Referring to FIG. 4 and FIG. 5 again, the support 13 includes a fixing board 131, an extension board 132 and two brackets 133. The extension board 132 connects the fixing board 131 and the two brackets 133. The extension board 132 extends away from a first end 1314 of the fixing board 131 and toward two sides of the fixing board 131. The first end 1314 of the fixing board 131 is closed to the end plate 113. The extension board 132 is perpendicular to the fixing board 131. The two brackets 133 extend and bent from the first end 1314 of the fixing board 131 upwards. The two brackets 133 are perpendicular to the fixing board 131. Specifically, the two brackets 133 respectively extend from two ends of the extension board 132. The two brackets 133 are also perpendicular to the extension board 132 and located at the same side of the extension board 132.

The fixing board 131 is a strip board. The fixing board 131 is perpendicular to the end plate 113. The fixing board 131 is fixed on the bottom plate 111 of the case 11 and located in the cavity 114. Specifically, a second end 1312 of the fixing board 131 away from the 113 is fixed on the bottom plate 111 of the case 11 via screws. The first end 1314 of the fixing board 131 closed to the end plate 113 can be uplifted away from the bottom plate 111 under an external force. Two blocks 1311 are formed on the first end 1314 of the fixing board 131. The two blocks 1311 extend from the first end 1314 of the fixing board 131 away from the same side of the fixing board 131. The two blocks 1311 are perpendicular to the fixing board 131. Each block 1311 is substantially triangular. A width of the block 1311 is gradually reduced away from the fixing board 131. Each block 1311 is held in a corresponding first groove 115, as shown in FIG. 1. Referring to FIG. 6 at the same time, two second grooves 210 are defined on the housing 200. The two second grooves 210 are respectively corresponding to the two first grooves 115 of the case 11. The two blocks 1311 of the support 13 can be stuck in the two second grooves 210.

The extension board 132 is perpendicular to the fixing board 131 and parallel to the end plate 113. The extension board 132 is mounted on the bottom plate 111 of the case 11. The extension board 132 and the fixing board 131 together form a T-shaped structure. Preferable, a connecting point between the fixing board 131 and extension board 132 is a mid-point of the extension board 132.

Each bracket 133 is perpendicular to the extension board 132 and parallel to the side plate 112 of the case 11. The two brackets 133 and the extension board 132 together form a U-shaped structure. Each bracket 133 is closed to a corresponding side plate 112 and spaced from the corresponding side plate 112. Each resisting portion 123 of the handle 12 is located between the bracket 133 and the corresponding side plate 112. Each bracket 133 includes a slide opening 1331. The slide opening 1331 is defined for held the bulge 1231 of the handle 12. Each slide opening 1331 is substantially ear-shaped. The slide opening 1331 faces the end plate 113. The bulges 1231 can slip into/out of the slide openings 1331 while the handle 12 rotated.

The elastic members 14 are respectively fixed on the flanges 117 of the case 11. Each elastic member 14 is substantially V-shaped. An opening of the elastic member 14 faces the end plate 113. Each elastic member 14 includes a first section 141 and a second section 142. One end of the first section 141 is connected to the second section 142, and the other end of the first section 141 is fixed on the flange 117 of the case 11. Specifically, each elastic member 14 is located between the bracket 133 of the support 13 and the corresponding side plate 112. And each elastic member 14 faces the resisting portion 123 of the handle 12. The peak A of the resisting portion 123 can slide along the second section 142 while the handle 12 rotated. For convenience, the connecting peak between the first section 141 and the second section 142 is defined as peak B.

The cooling module 2 is mounted in the case 11 of the installing assembly 1. Specifically, the cooling module 2 is fixed on the two side plates 112 of the case 11. The cooling module 2 is received in the cavity 114 and located upon the fixing board 131 of the support 13.

Referring to FIGS. 4-6, the heat sink 100 is installed as following:

The handle 12 is rotated to be out of the chamber 116. While the 12 rotated, the bulges 1231 of the resisting portions 123 gradually slide into the slide openings 1331 of the brackets 133. The handle 12 is sequentially rotated until the peak A resisted the peak B. At this moment, the handle 12 is at a horizontal attitude, as shown in FIG. 4, and the fixing portion 122 of the handle 12 is perpendicular to the end plate 113. The peaks A of the resisting portions 123 are stuck at the peaks B. The bulges 1231 of the handle 12 are completely stuck into the slide openings 1331 to resist brackets 133, thereof the end 1314 of the fixing board 131 of the support 13 being uplifted. Thus, the blocks 1311 are pushed back into the first grooves 115 of the case 11.

Then, the heat sink 100 is pushed into an electronic device (not shown in the figures) with the housing 200 via the operating portion 121 of the handle 12 to make the blocks 1311 of the support 13 corresponding to the second grooves 210 of the housing 200.

At last, the handle 12 is rotated in a reverse direction to be at a vertical attitude and received in the chamber 116 of the case 11, as shown in FIG. 5. While the handle 12 rotating with respect to the axle holes 1221, the bulges 1231 gradually slide out of the slide openings 1331 of the support 13, thereof the end 1314 of the fixing board 131 of the support 13 being dropped down. Thus, the blocks 1311 of the support 13 penetrates through the bottom plate 111 and are stuck into the second grooves 210 of the housing 200. At the same time, the peaks A of the resisting portions 123 slide from the peaks B of the elastic member 14 along the second section 142 and resist the second section 142, thereof the second section 14 being stretched. Thus, the handle 12 is received and fixed in the chamber 116 of the case 11 under elastic forces of the elastic members 14.

In a similar way, the heat sink 100 is dismantled as following:

The handle 12 is rotated to be out of the chamber 116. While the handle 12 rotated, the bulges 1231 of the resisting portions 123 gradually slide into the slide openings 1331 of the brackets 133. The 12 is sequentially rotated until the 12 being perpendicular to the 113 and the peaks A of the resisting portions 123 resisting the peaks B of the elastic members 14. At this moment, the bulges 1231 of the resisting portions 123 are completely held in the slide openings 1331 of the support 13. The end 1314 of the fixing board of the support 13 is uplifted and the blocks 1311 of the support 13 are out of the second grooves 210 of the housing 200. Then, the heat sink 100 is pulled out of the electrical device via the operating portion 121 of the handle 12. The handle 12 is rotated to be received in the chamber 116 of the case 11.

Compared to the traditional heat sinks, the heat sink 100 in the present disclosure is installed and dismantled via the interaction between the handle 12, the support 13 and the elastic members 14. The heat sink 100 is installed via being pushed into the electronic device and folding the handle 12; and the heat sink 100 is dismantled via unfolding the handle 12 and being pulled out of the electronic device, thereof being more simple and convenient in installation and demolition.

The embodiment shown and described above is only an example. Many details are often found in the art such as the other features of the installing assembly. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. An installing assembly for installing a heat sink in a housing comprising:
   a case having a bottom plate;
   a support fixed in the case and comprising:
      a fixing board fixed on the bottom plate and forming two blocks thereon; and
      two brackets extending and being bent from an end of the fixing board, each of the two brackets defining a slide slot; and
   a handle rotatablely mounted in the case and actively connected with the support, the handle comprising two bulges corresponding to the slide slots, the bulges being held in the slide slots;
   when the heat sink is installed, the handle is rotated to be at a vertical attitude, the bulges are out of the slide openings, and the blocks are stuck on the housing; and
   when the heat sink is dismantled, the handle is rotated to be at a horizontal attitude, and the bulges are stuck into the slide openings to resist the brackets, thereby the fixing board being uplifted and the blocks being pulled out of the housing.

2. The installing assembly of claim 1, wherein the case further comprises an end plate and two side plates, the two side plates are parallel to and spaced from each other, each side plate is perpendicular to the bottom plate, and the end plate is perpendicularly connected to the side plates and the bottom plate.

3. The installing assembly of claim 2, wherein the bottom plate defines two first grooves, the first grooves are closed to the end plate, the blocks are held in the first grooves.

4. The installing assembly of claim 2, wherein the end plate defines a chamber, when the handle is at a vertical attitude, the handle is received in the chamber.

5. The installing assembly of claim 2, wherein the handle defines two axle holes, the handle is rotatablely mounted on the side plates of the case via the axle holes.

6. The installing assembly of claim 2, further comprises two elastic members, wherein the two elastic members are respectively fixed on the side plates, and the handle is actively connected with the elastic members.

7. The installing assembly of claim 6, wherein each side plate comprises a flange, the flanges are closed to and spaced from the end plate, and each elastic member is fixed on a corresponding flange.

8. The installing assembly of claim 7, wherein each elastic member is located between the bracket of the support and the side plate.

9. The installing assembly of claim 8, wherein each elastic member is V-shaped, an opening of the elastic member faces the handle.

10. The installing assembly of claim 9, wherein the handle comprises two resisting portions, the bulges are respectively formed on the resisting portions, and the resisting portions are respectively resisted on the elastic members.

11. The installing assembly of claim 10, wherein each elastic member comprises a first section and a second section, one end of the first section is connected to the second section, and the other end of the first section is fixed on the flange.

12. The installing assembly of claim 10, wherein each resisting portion is resisted on the second section of a corresponding elastic member.

13. The installing assembly of claim 2, wherein the fixing board of the support is perpendicular to the end plate of the case, a second end away from the end plate of the fixing board is fixed on the bottom plate, and a first end closed to the end plate of the fixing board is free.

14. The installing assembly of claim 13, wherein the blocks are formed on the first end of the fixing board, and the brackets extend and bent from the first end of the fixing board.

15. The installing assembly of claim 14, wherein the support further comprises an extension board, the extension board connects the fixing board and the two brackets.

16. The installing assembly of claim 15, wherein the extension board extends away from the first end of the fixing board and toward two sides of the fixing board perpendicularly.

17. The installing assembly of claim 16, wherein the two brackets extend from two ends of the extension board perpendicularly, and the two brackets are located at the same side of the extension board.

18. The installing assembly of claim 17, wherein the two brackets are perpendicular to the extension board and the fixing board.

19. A heat sink comprising:
   an installing assembly for installing a heat sink on a housing, the installing assembly comprising:
      a case comprising a bottom plate;
      a support fixed in the case and comprising:
         a fixing board fixed on the bottom plate and forming two blocks thereon; and two brackets extending and being bent from an end of the fixing board, each of the two bracket defining a slide slot; and a handle rotatablely mounted in the case and actively connected with the support, the handle comprising two bulges corresponding to the slide slots, the bulges being held in the slide slots; and a cooling module mounted in the case of the installing assembly;

when the heat sink is installed, the handle is rotated to be at a vertical attitude, the bulges are out of the slide openings, and the blocks are stuck on the housing; and when the heat sink is dismantled, the handle is rotated to be at a horizontal attitude, and the bulges are stuck into the slide openings to resist the brackets, thereby the fixing board being uplifted and the blocks being pulled out of the housing.

20. The heat sink of claim 19, wherein the case defines a cavity, the cooling module is received in the cavity and located upon the fixing board of the support.

\* \* \* \* \*